United States Patent [19]
VanZeghbroeck

[11] Patent Number: 5,600,130
[45] Date of Patent: Feb. 4, 1997

[54] TWO-DIMENSIONAL OPTOELECTRONIC ARRAY MODULE

[75] Inventor: Bart J. VanZeghbroeck, Boulder, Colo.

[73] Assignee: The Regents of the University of Colorado, Boulder, Colo.

[21] Appl. No.: 515,284

[22] Filed: Aug. 15, 1995

Related U.S. Application Data

[63] Continuation of Ser. No. 261,605, Jun. 17, 1994, abandoned.

[51] Int. Cl.$^6$ ................................................ H01J 40/14
[52] U.S. Cl. ...................... 250/214.1; 250/551; 257/431; 257/436
[58] Field of Search ........................... 250/214.1, 214 R, 250/551, 214; 257/431, 436, 435; 156/630

[56] References Cited

U.S. PATENT DOCUMENTS

| | | | |
|---|---|---|---|
| 3,487,223 | 12/1969 | St. John | 250/216 |
| 3,758,797 | 9/1973 | Peterson et al. | 307/324 |
| 4,160,045 | 7/1979 | Longshore | 204/192.32 |
| 4,514,581 | 4/1985 | Fan et al. | 257/436 |
| 4,532,537 | 7/1985 | Kane | 257/653 |
| 4,754,139 | 6/1988 | Ennulat et al. | 250/332 |
| 4,784,702 | 11/1988 | Henri | 136/258 |
| 4,876,586 | 10/1989 | Dyck et al. | 257/436 |
| 4,983,251 | 1/1991 | Haisma et al. | 156/630 |
| 5,045,908 | 9/1991 | Lebby | 257/458 |
| 5,162,251 | 11/1992 | Poole et al. | 437/53 |
| 5,163,179 | 11/1992 | Pellegrini | 257/451 |

OTHER PUBLICATIONS

Streetman, Ben G., Solid State Electronic Devices, Third Edition pp. 212–215.
"An Etch–Stop Utilizing Selective Etching of N–Type Silicon by Pulsed Potential Anodization" Wang et al, *Journal of Microelectromagnetical Systems*, vol. 1, pp. 189–192.
"Fabrication of Novel Three–Dimensional Microstructures by the Anisotropic Etching of (100) and (110) Silicon", by E. Bassous, *IEEE Transaction on Electron Devices*, vol. ED–25, pp. 1178–1184.
"High–Performance Heat Sinking for VLSI" by Tuckerman et al, *IEEE Electron Device Letters*, vol. EDL–2 1981, p. 126.
"High–Power Vertical–Cavity Surface Emitting Lasers", by Peters et al, *Electronics Letter*, vol. 29 1983.
"Nanoscale Ultrafast Metal–Semiconductor–Metal Photoconductors", by Liu et al *Proc. Device Research Conference*, paper VIB–1, Cambridge, Mass., Jun. 1992.
"5.2–GHz Bandwidth Monolithic GaAs Optoelectronic Receiver", by Harder et al *IEEE Electron Device Letters*, vol. 9, No. 4, Apr. 1988.

*Primary Examiner*—Stephone Allen
*Attorney, Agent, or Firm*—F. A. Sirr; E. C. Hancock; Holland & Hart llp

[57] ABSTRACT

A two-dimensional optoelectronic array module contains metal, semiconductor metal, or P-I-N photodetectors which detect light, and converts it to electrical signals provided to conventional integrated circuitry contained on the same wafer. The circuitry processes the electrical signals, and drives an array of vertical cavity lasers on another wafer through solder bumps which carry driver signals and connect the two wafers together. The detectors are thin membranes formed by etching intrinsic silicon wafers, and have anti-reflective coatings and Schottky metal contacts. The module is cooled via microchannels.

10 Claims, 6 Drawing Sheets

TWO-DIMENSIONAL OPTOELECTRONIC ARRAY MODULE

This invention was made with Government Support under a contract by the National Science Foundation. The Government has certain rights in this invention.

This applicaton is a continuation of patent application Ser. No. 08/261,605, filed Jun. 17, 1994, entitled TWO-DIMENSIONAL OPTOELECTRONIC ARRAY MODULE, now abandoned.

BACKGROUND OF THE INVENTION

1. Field of the Invention

This invention relates to apparatus and methods for converting light to electrical current for utility in intelligent optical relays. That is, this invention relates to apparatus and methods for detecting optical signals, processing the data with electronic circuits and emitting the processed data again as optical signals. More particularly, this invention relates to optical relay structures and processes which utilize thin membrane photodetectors formed on a silicon wafer which is cooled with microchannels.

2. Description of the Related Art

Silicon photodetectors are known in the art. Most photodetectors are P-I-N type (p-type - intrinsic - n-type silicon layers). To obtain high responsivity, the intrinsic layer of P-I-N photodetectors must be around one to three times the absorption length (for 830 nm light, the thickness would be around 10 to 30 micrometers). Such detectors have a slow response time (around 1 microsecond), unless a large voltage is applied. Furthermore, the layer structure is not compatible with that of standard electronic circuits. Metal-semiconductor-metal photodetectors on thin membranes overcome these disadvantages by being fully compatible with standard electronic circuits, simpler to fabricate, and thinner, therefore, faster. In addition, both metal contacts can be placed on the same side of the wafer. Metal-semiconductor-metal detectors are known in the art. See "Nanoscale Ultrafast Metal-Semiconductor-Metal Photoconductors," by Y. Liu et al, *Proc. Device Research Conference*, paper VIB-1, Cambridge, Mass., June 1992. However, use of the thin membrane as an absorbing region, surface texturing, and operation at 830 nm wavelength are not taught by this reference. The use of surface texturing traps light better, allowing a thinner membrane to be used, and thereby increasing the bandwidth of the device.

It is known in the prior art to flip chip bond vertical cavity lasers. An article describing this process is "High-power Vertical-cavity Surface Emitting Lasers," by F. H. Peters et al, *Electronics Letter*, Vol. 29, 1983. It is known to use microchannels to cool silicon wafers. See, for example, "High-Performance Heat Sinking for VLSI," D. B. Tuckerman et al, *IEEE Electr. Dev. Lett.*, Vol. EDL-2, P. 126, 1981. Other types of cooling include U.S. Pat. No. 5,163,179, by Pelligrini, which discloses an IR detector capable of passive cooling because of its structure and material. Etching opens the active area of the detector, and the detector is illuminated from the back. Also, U.S. Pat. No. 4,754,139 by Ennulat et al discloses an IR detector array cooled, in part, by positioning each detector over an air filled or evacuated chamber.

Light trapping in a silicon detector by roughening the surface with sandblasting is known. For instance, see U.S. Pat. No. 3,487,223 for "Multiple Internal Reflection Structure In A Silicon Detector Which Is Obtained By Sandblasting," by A. E. St. John. Etching silicon membranes is also known in the art. "An Etch-Stop Utilizing Selective Etching of N-Type Silicon by Pulsed Potential Anodization," S. S. Wang et al, *Journal of Microelectromechanical Systems*, Vol. 1, pp 187–192, and "Fabrication of Novel Three-Dimensional Microstructure by the Anisotropic Etching of (100) and (110) Silicon," by E. Bassous, *IEEE Transaction on Electron Devices*, Vol. ED-25, pp 1178–1184, are two articles describing this process.

U.S. Pat. No. 5,223,081 by Doan discloses a method of roughening a silicon substrate comprising the steps of depositing a metal layer on the substrate, heating to form a metal silicide layer, and etching to remove the metal and metal silicide.

U.S. Pat. No. 5,162,251 by Poole et al discloses a two-step method for abrasively thinning a silicon CCD. The CCD is mounted to a glass substrate for support and to allow backside illumination.

U.S. Pat. No. 4,983,251 by Haisma et al discloses a method of manufacturing semiconductor devices comprising polishing a support body and a monocrystalline semiconductor body, providing an insulation layer, connecting the bodies, heat treating them, and etching the semiconductor body to a thin layer (to prevent circulation currents).

U.S. Pat. No. 4,160,045 by Longshore discloses a method for producing a rough photosensitive surface by depositing islands of indium on the surface and bombarding with ions.

Reactive Ion Etching (RIE) is a standard and highly reproducible dry etching process used in the silicon microfabrication industry. It creates shallow textured surfaces with high light trapping capacity by the nature of micron-sized corrugation that are formed during this process.

Back illumination of photodetectors is known in the art. U.S. Pat. No. 4,784,702 by Henri discloses a P-I-N photodiode of amorphous silicon. The P and N layers are formed by multilayers rather than doping. The diodes may be illuminated from either side. U.S. Pat. No. 3,758,797 by Peterson et al discloses a solid state bistable switching device. The silicon layer may be illuminated from the backside.

SUMMARY OF THE INVENTION

It is an object of the present invention to provide a metal-semiconductor-metal photodetector for detecting input light, and generating a photocurrent as a function of the input light. The detector is made up of a semiconductor substrate capable of internally releasing free carriers in response to the presence of photons, where the substrate has a membrane portion of a thickness generally transverse to the direction from which the input light is received on the order of an absorption length for the input light or less. The membrane has a roughened surface for light trapping within the membrane. Conducting contacts are attached to the membrane for voltage biasing the membrane, and a voltage source is attached to the contacts for generating a voltage across the contacts.

It is a feature of the present invention to have circuitry fabricated on the substrate and connected the metal contacts of the detector for processing the photocurrent from the detector. As another feature, a plurality of the photodetectors are formed into an array which also has a plurality of means for generating or modulation light beams, such as vertical cavity lasers or modulators, responsive to the processed photocurrent form the circuitry. The array has microchannels within the substrates of the photodetectors for cooling the electronic circuits.

It is a feature of the present invention that the contacts may be attached on the same side of the membrane. One or both of the contacts may be formed of a transparent conductive material.

The membrane may be a single layer of intrinsic or lightly doped silicon or a P-I-N diode. In the case of the P-I-N diode, one contact is made to the p-type layer, and one contact is made to the n-type layer. As a further feature, the membrane may have an antireflective coating applied to the side of the membrane into which light is transmitted.

Those having normal skill in the art will recognize the foregoing and other objects, features, advantages and application of the present invention form the following more detailed description of the preferred embodiments as illustrated in the accompanying drawings.

Note that section lines are omitted from some of the elements in several of the accompanying drawings, including FIGS. 1, 3–5, and 7–10. This is done for purposes of clarity, and those having normal skill in the art will recognize where section lines are normally placed.

DETAILED DESCRIPTION OF THE PREFERRED EMBODIMENTS

Figure 1:
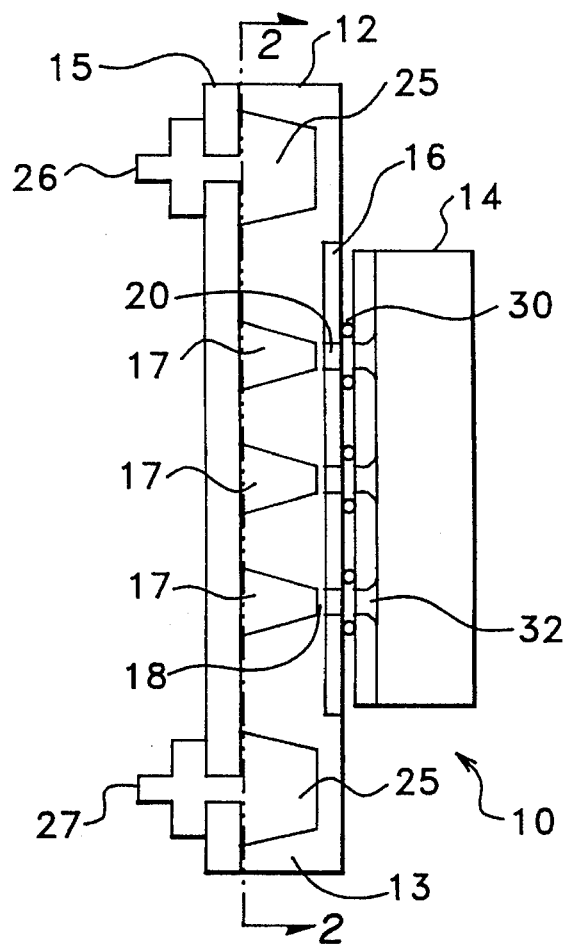
FIG. 1 is a sectioned side view of a two-dimensional optoelectronic array module in accordance with the present invention.

FIG. 1 shows a section side view of a two-dimensional optoelectronic array module 10 in accordance with this invention. Module 10 comprises a detector assembly 12 and a laser array 14, connected physically and electrically by solder bumps 30. The detector assembly 12 is cooled by microchannels carrying a liquid, such as water, or a gas, such as freon. The coolant comes in through coolant entrance 26 and leaves coolant exit 27. Its path is shown in more detail in FIG. 2. A transparent cover plate 15 is soldered, glued, or bonded to silicon wafer 13 retains the coolant, while permitting light to enter detector holes 17 from the left side in FIG. 1. A non-transparent plate with holes or transparent windows at the detector sites may also be used.

Figure 5:
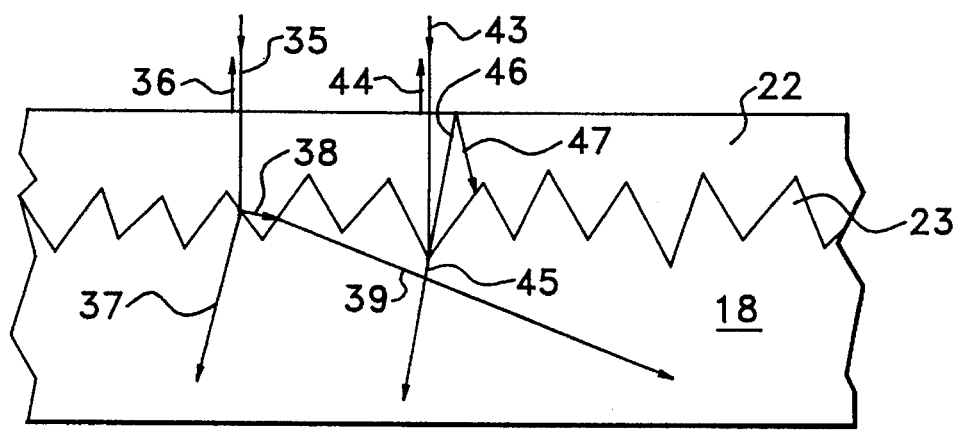
FIG. 5 is an enlarged sectioned side view of a segment of the membrane area of the detector of FIG. 3 showing light paths.
Figure 6:
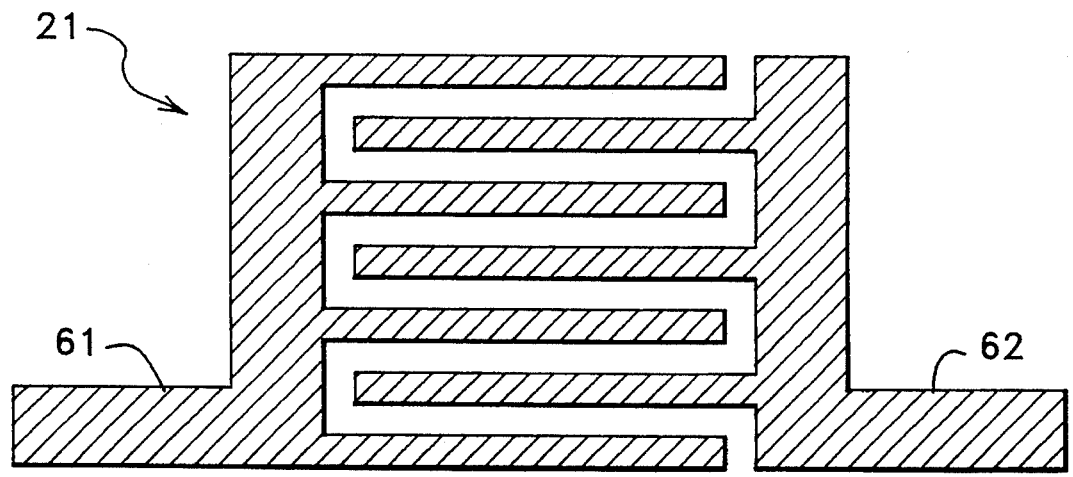
FIG. 6 is a front view showing the pattern of the metal contact area of the FIG. 3 embodiment.

The light is absorbed in membranes 18 as shown in FIG. 5. As is well known in the field of metal-semiconductor-metal photodetectors, as light is absorbed, thereby generating free carriers in the semiconductor, current begins to flow through the voltage biased medium. The metal contact area 21 comprises a Schottky contact as shown in FIG. 6, which provides the voltage bias shown in FIG. 7. The current induced in the silicon wafer 13 is detected and amplified, and passed to contact 21, which is connected by metal wires (not shown) to pins of conventional integrated circuitry 16 in FIG. 1. In general, the low-level optical signals are detected by a high-speed receiver circuit (not shown), and amplified to voltage levels which are compatible with the interfacing logic. Such receivers are known in the art. One such receiver is described in "5.2-GHz Bandwidth Monolithic GaAs Optoelectronic Receiver" by Harder et al, *IEEE Electron Device Letters*, Vol. 9, No. 4, April 1988.

Information may be encoded in the selection of which detectors are illuminated, or their order, or the intensity of the illumination. This encoded information may then be processed in a variety of ways by the conventional circuitry 16. The circuitry then selects which vertical cavity lasers 32 to illuminate. The electrical signals are carried from circuitry 16 to laser array 14 through solder bumps 30. Solder bumps 30 may be conventional lead/tin alloy. These electrical signals selectively power the lasers 32 contained in laser array 14. The selected lasers 32 emit laser beams. The use of such vertical cavity lasers is well known to those skilled in the art. Other light emitters or modulators could be used instead of the vertical cavity lasers.

Figure 2:
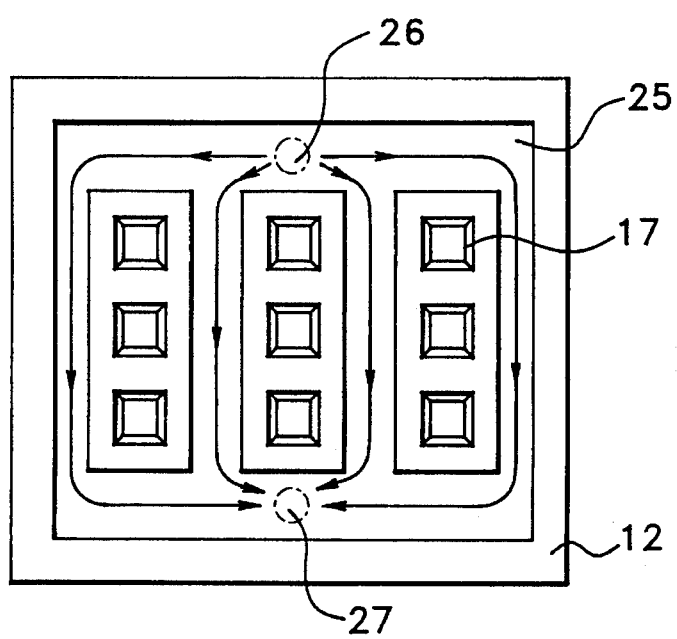
FIG. 2 is a front view of the invention taken along 2—2 in FIG. 1, showing the microchannels.

FIG. 2 shows a front (sectioned) view of detector assembly 12. The path of the coolant microchannels is apparent in this figure. The coolant enters coolant entrance 26, flows between the detector holes 17 and exits through coolant exit 27.

Figure 3:
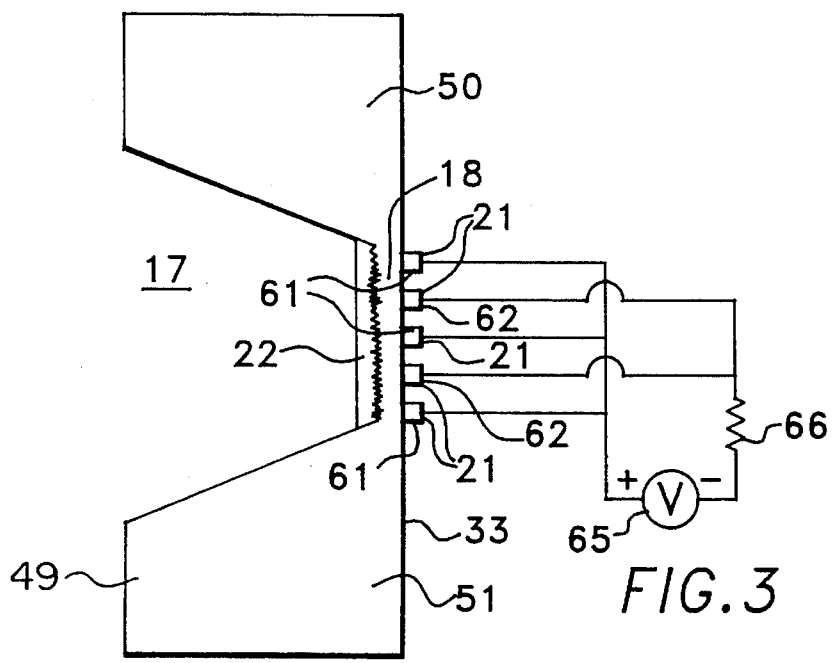
FIG. 3 is a sectioned side view of one embodiment of a detector.

FIG. 3 shows one detector 33 from detector assembly 12. The detector comprises a silicon substrate 49, a thin silicon membrane segment 18, having a roughened interior surface, which is coated with an antireflective (AR) coating 22, and an area of metal contacts 21. Each contact 21 has a first side 61, connected to a positive voltage form voltage source 65. The other side 62 of contact 21 is connected to a negative terminal, or ground, through resistor 66. Contact 21 creates an electrical field within detector membrane 18, allowing current to flow when carriers are released by photons.

The detector holes 17 (as well as the microchannels 25) are etched into silicon wafer 13 by either wet or dry etching. Such techniques are well-known fabrication processes. Wet chemical etching is generally achieved by dissolving layers of silicon in a liquid bath of acid. Wet etching is quick, but is not as uniform or as well controlled as dry etching. If a relatively thick membrane 18 is desired, wet etching may be used. Dry etching is much slower, but results in a more even, controlled process. For surface variations on the order of one micron, dry etching is preferred.

Dry etching is accomplished by generating a plasma in a chamber containing the wafer 13. For example, a voltage is applied across two parallel plates, and a gas, such as Freon 14, is inserted at a pressure of around 100 millitorrs. The gas ionizes, producing fluorine radicals, which react with the surface of the wafer 13 to form silicon fluoride gas. In either wet or dry etching, a mask is used to protect portions of the surface of wafer 13 which are not to be etched away.

Generally, sandblasting cannot be used to roughen the surface 23 of membrane 18, because it goes too deep.

Figure 4:
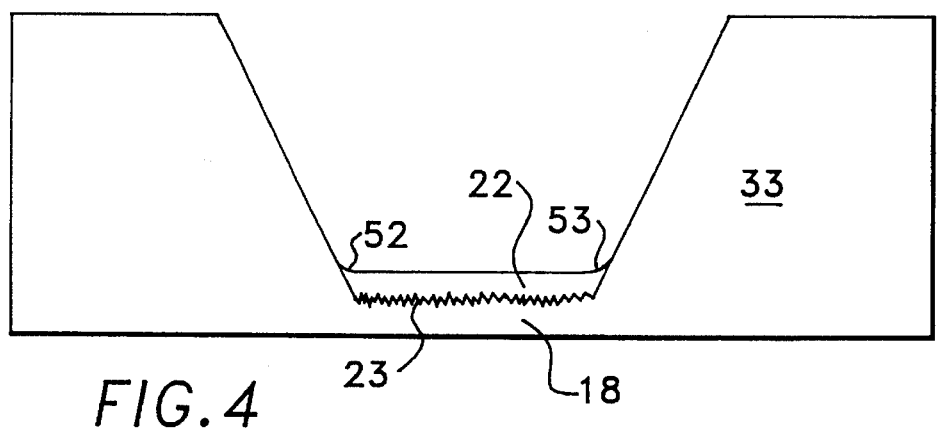
FIG. 4 is a section side view of the detector element of FIG. 3 showing the antireflective coating and the rough surface.

For a laser which operates at around 0.8 microns, as many commercial lasers do, the desired membrane thickness is about five micrometers. This is because the absorption length in silicon at 0.8 microns is around ten microns. The light beams bounce back and forth several times within membrane 18, as shown in FIG. 5, so most of the light will be absorbed in a five-micron membrane. As shown in FIG. 4, the rough surface 23 of membrane 18 is ideally around one micrometer in depth. The roughness must be less deep than the membrane thickness, yet still be large enough for effective light trapping. A very thin membrane insures quick response time because the distance the photogenerated carriers travel before reaching the contact is small.

The AR coating 22 is normally applied by pouring PMMA dissolved in a solvent, such as chlorobenzine, onto rough surface 23, and spinning the detector 33 to spread the AR coating 22 and dissolve the solvent. The PMMA and solvent sink into the discontinuities, and the spinning results in a fairly smooth surface, but leaves little tails of AR coating 52 and 53. A smoother surface may be obtained by heating AR coating 22. Of course, walls 50 and 51 of silicon substrate 49 extend all the way around detector 33, and tails 52 and 53 extend all the way around the base of walls 50 and 51. Other AR coatings are also possible.

FIG. 5 is a close-up view of a segment of membrane 18 and AR coating 22. The purpose of surface roughness 23 and the AR coating 22 is illustrated by the paths taken by several light beams 35 and 43. The light is shown entering the top of the membrane 18 through AR coating 22, but those skilled in the art will appreciate that light could also enter the bottom of membrane 18, and the roughening would work almost as well to trap light. However, it is preferable to place the AR coating on the side where the light enters the semiconductor.

Light beam 35 hits AR coating 22, and most of it passes through. The AR coating, as is typical, has a fairly low index of refraction, somewhere in between that of silicon, which is around three, and air, which is around one. Thus, less of the light is reflected back from AR coating 22 than would be from a silicon surface. This reflected beam is shown at 36 and 44. The portion of beam 35 that is transmitted AR coating 22 passes through coating 22 until it reaches the roughened surface 23. Part of beam 35 is transmitted into membrane 18 as beam 37. Part of beam 35 is reflected as beam 38. The angle of incidence on surface 23 equals the angle of reflection, so that beam 38 travels sideways as shown. When beam 38 hits another portion of surface 23, again part of it is transmitted as beam 39. Part of it is reflected (not shown). Thus, the roughened surface 23 of membrane 18 traps the light, by reflecting it at various angles rather than straight back out.

Many of the reflected beams will travel at angles resulting in hitting surface 23 again. Other reflected beams will travel back to the top surface of AR coating 22, and partially or fully reflect back down towards surface 23. This phenomenon is illustrated by beams 43 and 45–47. Beam 43 hits AR coating 22 and a small portion is reflected back as beam 44. The rest of beam 43 travels through AR coating 22 until it reaches surface 23. Part of the beam is transmitted as beam 45, and part is reflected as beam 46. Beam 46 hits the top surface of AR coating 22 and reflects back as beam 47. If the angle between beam 46 and the normal to the top surface of AR coating 22 is great enough, all of the light is reflected because of total internal reflection.

Of course, FIG. 5 shows only the first few reflections of the beams for clarity. In reality, part of beam 37 would reflect off of the bottom surface of membrane 18 and part would be transmitted. Beams 39, 45, and 47 would also continue to propagate and reflect. However, membrane 18 is a low-doped silicon semiconductor that is voltage biased by metal contacts 21. Therefore, the photons comprising the beams will be absorbed into the membrane 18, resulting in electron-hole pairs. The voltage biasing causes the electrons and holes to travel in different directions, so that few of them recombine and a current results.

The five micrometer depth of the membrane in the preferred embodiment of FIG. 3 is approximately equal to half the absorption length of silicon at around 0.8 micrometer wavelength light, which is the wavelength of most readily available lasers. The definition of absorption length is that $1-e^{-1/2}$ of the light is absorbed in half of the absorption length. Thus, around 60% of the light is absorbed in one straight pass through the membrane 18.

The intensity of the light decreases exponentially as photons are absorbed, creating electron hole pairs in the silicon. The surface roughening results in random scattering of the light, such that most of it will make several passes through the membrane 18. This results in absorption of most of the lights. The response time is much quicker for thin membranes such as 18, than for more conventional semiconductor photodetectors, because the small depletion region means that the carriers (electrons and holes) are pulled out fast at low voltages, such as commonly available five volts. P-I-N detectors require a much higher voltage to achieve the same response time. The thin M-S-M detectors of this invention can achieve up to a one-hundred gigahertz bandwidth. Conventional thick detectors (around 30 microns) can achieve only 3 Ghz at 100 volts.

Another advantage of the thin membrane photodetector of the current invention is that it can be constructed integrally as part of conventional integrated circuit chips. The chip maker would just have to leave an open portion of intrinsic silicon, which could them be etched, etc., to form the photodetector. The silicon may be slightly doped, up to $10^{15}$ carriers per cubic centimeter. If it is more doped than that, it becomes more difficult to generate a depletion region.

Figure 7:
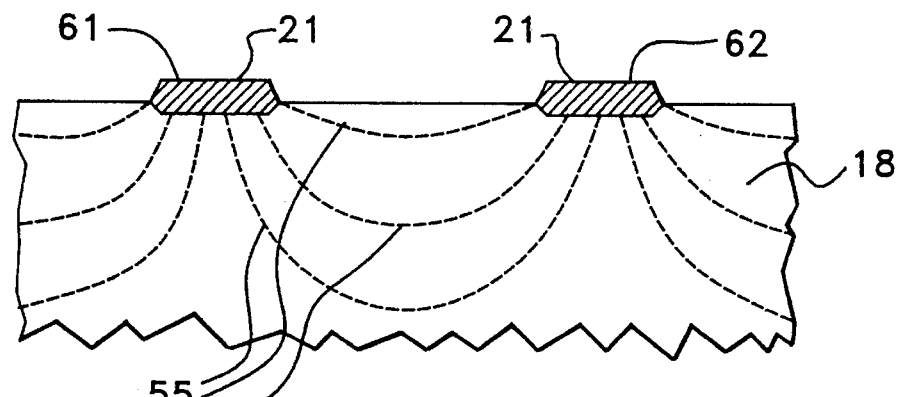
FIG. 7 shows the distribution of electric field lines formed in the membrane of the FIG. 3 embodiment between the metal contact slides.

FIG. 6 shows the Schottky metal contact area 21 used to generate an electrical field within membrane 18. Contact 21 has two sides, 61 and 62. One side is connected to a positive voltage, and the other side is connected to a negative voltage or ground to create an electrical field within membrane 18, as shown in FIG. 7. Each side of the contact is formed with a plurality of fingers which fit between each other. The interleaved fingers are arrayed across the bottom of a detector hole, as shown in FIG. 3. The advantage of this configuration is that both sides of the contact are on the same side of the wafer. This type of contact area also results in a fast detector response because the fingers cover a large photosensitive area, while providing a short distance for the carriers to travel. Of course, the contacts may also be on either side of the membrane. In that case, at least one of the contacts would have to be formed of a transparent material, such as indium tin oxide, or else would have to be fingers or the like, in order to allow a significant amount of light through.

When voltage is applied across contact 21, field lines 55 are formed in the membrane 18, as shown in FIG. 7. If the light enters the side of membrane 18 containing contact 21, the area under contact 21 is shaded. However, if the light enters the other side of membrane 18, the entire area within the membrane is illuminated, resulting in better response.

Figure 8:
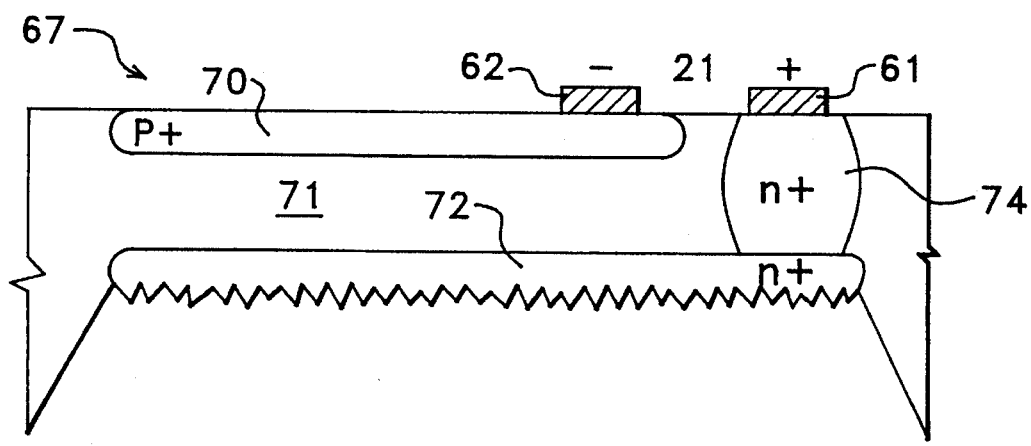
FIG. 8 shows a second embodiment of a detector utilizing a PN diode.

FIG. 8 shows a second embodiment of the present invention. The detector is similar to the detector of FIG. 3, but instead of an intrinsic layer of silicon, a PN (or P-I-N) diode 67, formed of a highly-doped p-type layer 70, a low-doped (or intrinsic) layer 71, and a highly-doped n-type layer 72, forms the membrane. The low-doped region 71 is sandwiched between layer 70 and layer 72. A bridge 74 of n-type silicon, connects contact 21, side 61, to n-type layer 72. Contact 21, side 62, is connected to p-type layer 70. Contact side 61 is at a positive voltage, and contact side 62 is at ground, reverse biasing the diode. Thus, no current flows in the diode unless a photocurrent is generated. Light incident on this structure causes the generation of electron-hole pairs throughout the membrane. The electrons flow to the n+layer, while the holes flow to the p+ layer, causing a photocurrent between terminals 61 and 62.

Figure 9:
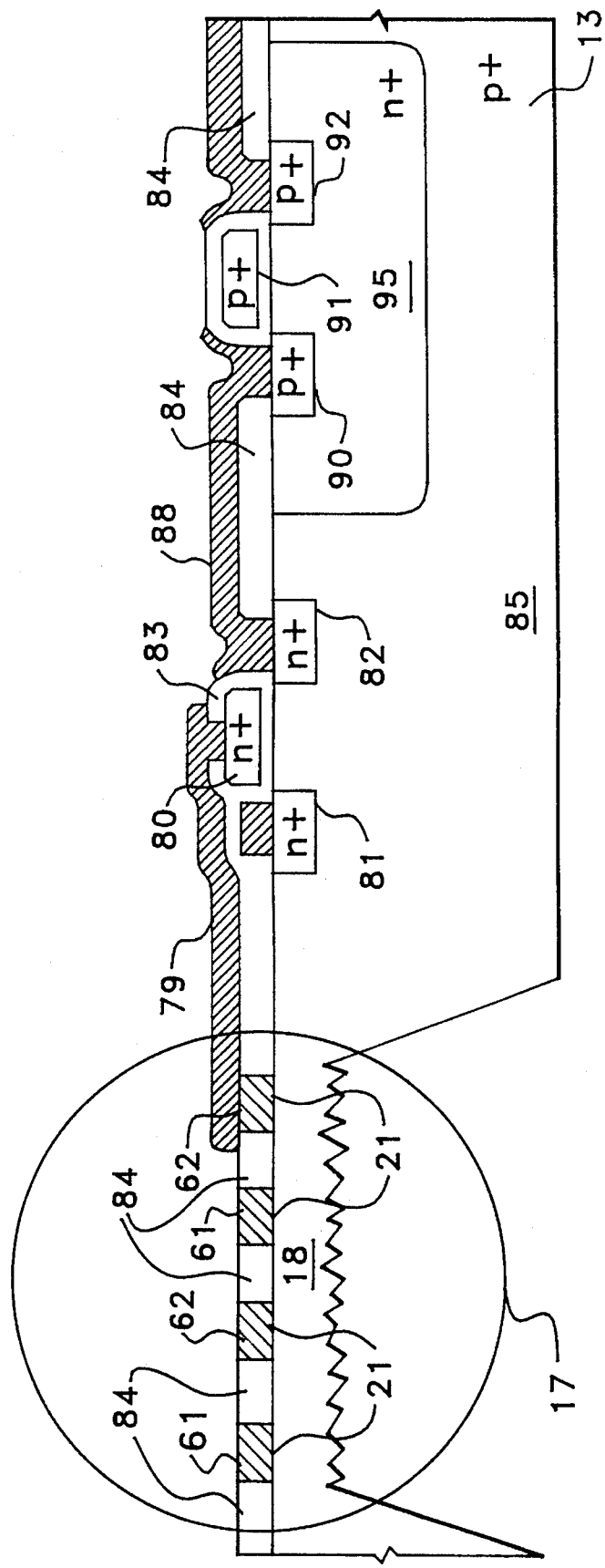
FIG. 9 shows a cross-section of an embodiment along the lines of FIG. 3 with integrated CMOS circuitry.

FIG. 9 shows the metal-semiconductor-metal detector embodiment of FIG. 3 with integrated CMOS circuitry. CMOS circuitry is well known in the art. For an example of a cross-section of an n-well CMOS circuit, refer to "Device Electronics for Integrated Circuits", FIG. 9.18, Page 456, by Richard S. Muller et al, second edition, John Wiley and Sons.

Figure 11:
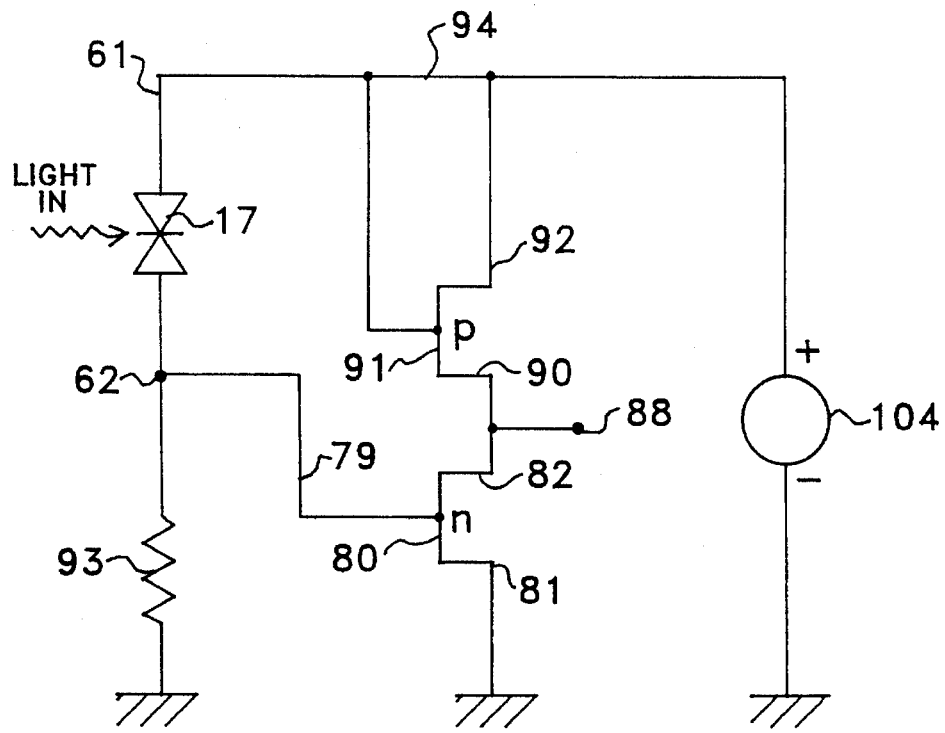
FIG. 11 is a circuit diagram of the circuit implemented by the structure of FIG. 9.

Ground side 62 of contact 21 is connected to a metal conductor 79 leading to the polysilicon gate 80 of the NMOS transistor. Source 81 is a region of highly doped n-type silicon within the p-type substrate 85. As shown in FIG. 11, a second conductor 94 leads from the positive side 61 of contact 21 to the positive terminal of the voltage source 104. Polysilicon gate 80 is a region of n-type silicon surrounded by a layer of insulating material 83, preferably silicon dioxide. Insulation material 84 is also preferably silicon dioxide.

The drain 82 of the n-gate 80 is connected by conductor 88 to the drain 90 of a p-gate 91. Drain 82 is formed of a region of p-type silicon within n-well 95. The p-gate source 92 and p+ gate 91 of the p-type transistor are also regions of p-type silicon, and are connected to the positive terminal of the voltage source 104 by a conductor 94 (FIG. 11).

Figure 10:
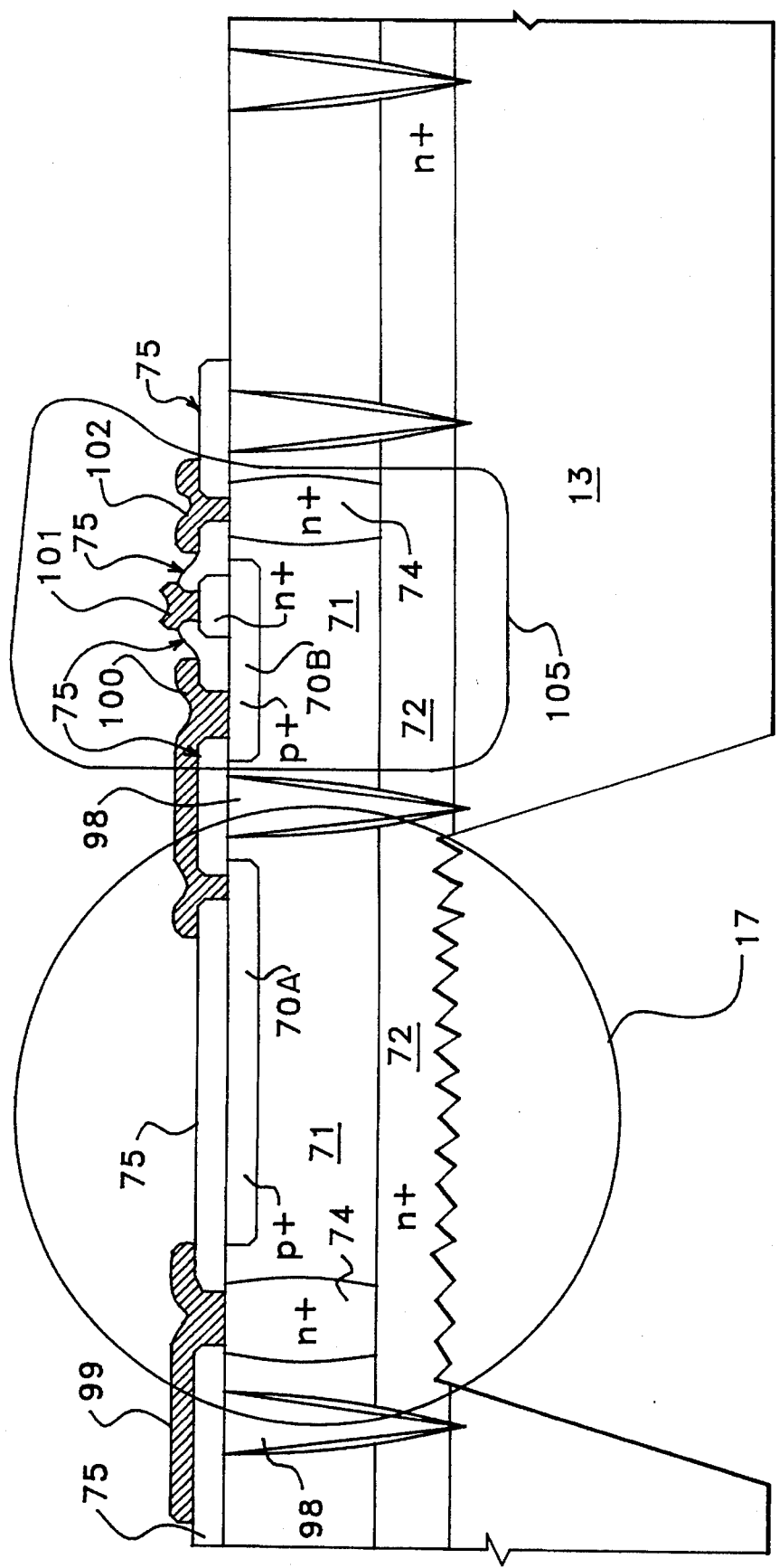
FIG. 10 shows a cross-section of a FIG. 8 type of embodiment with integrated bipolar transistor circuitry.

Operation of the device of FIG. 9 is shown in FIG. 11. FIG. 10 shows the P-I-N (or PN) diode 67 of FIG. 8 with integrated bipolar transistor circuitry. Each P-I-N diode 67 is isolated from the others by a trench isolation 98, as are the bipolar transistors 105. An example of a bipolar transistor process featuring trench isolation can be found in "Process and Device Characterization for a 30-GHz $f_t$ Submicrometer Double Poly-Si Bipolar Technology Using $BF_2$-Implanted Base with Rapid Thermal Process" by Tadanori Yamaguchi et al., *IEEE Transactions on Devices*, Vol. 40, No. 8, August 1993.

A series of pits 98 are etched in the p-type wafer 13 deep enough to separate the sections of low-doped layer 71 and n-type layer 72. The regions of p-type layer are already physically separated. Pits 98 are then filled with an insulating material, such as silicon dioxide. Insulation regions 75 are also preferably silicon dioxide.

Figure 12:
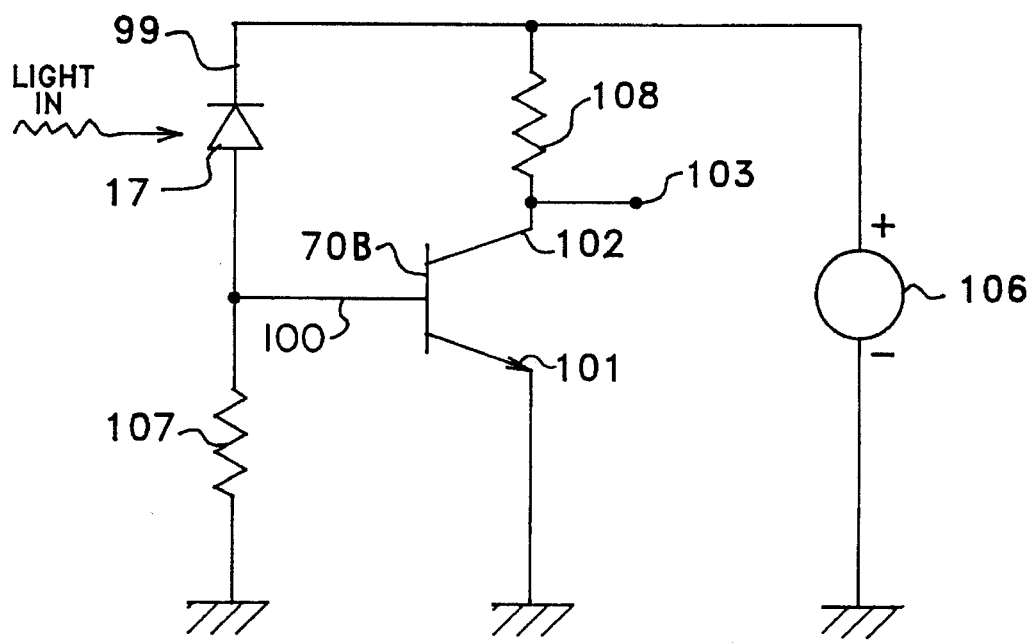
FIG. 12 is a circuit diagram of the circuit implemented by the structure of FIG. 10.

The n+ layer 74 of the P-I-N detector is connected through detector 99 to the positive terminal of voltage source 106 (FIG. 12). The p+layer 70A is connected through conductor 100 to the p+-type base region 70B of the bipolar transistor. The emitter contact 101 is connected to ground, while the collector contact 102 is connected via a resistor 108 to the positive terminal of voltage source 106 (FIG. 12). The operations of this circuit is shown in FIG. 12.

FIG. 11 shows a circuit diagram of the circuit implemented by the structure of FIG. 9. Of course, this circuit is merely an example, and those skilled in the art will appreciate that a variety of circuits could be implemented. The circuit operates as follows. Illumination of the detector 17 causes a photocurrent in membrane 18 (FIG. 9) between contacts 61 and 62, which increases the voltage on the n+ gate 80 on the n-type transistor. Contact 61 is connected to the positive terminal of power source 104, which is equivalent to power source 65 in FIG. 3. Contact 62 is connected to ground through resistor 93. Resistor 93 is equivalent to resistor 66 in FIG. 3. The larger gate voltage causes the current though both the n-type transistor 80 and the p-type transistor 91 to increase, thereby decreasing the voltage on conductor 88, which is also the output terminal of the device. This circuit inverts and amplifies the photocurrent and is an example of how the detector 17 can be combined with CMOS circuits on the same silicon substrate.

FIG. 12 shows the circuit implemented by the configuration of FIG. 10. Illumination of the detector 17 causes a photocurrent to flow from the voltage supply 106 through conductor 99, through the low-doped layer 71 (shown in FIG. 10) through conductor 100 into the base 70B of the bipolar transistor 105. This causes a collector current to flow from collector 102 to emitter 101, which lowers the voltage on the output terminal of the device 103 because of resistor 108. Conductor 100 is connected to ground through resistor 107. Those skilled in the art will appreciate that this concept could be extended to multiple gates in various configurations, depending on the designer's purpose.

While the exemplary preferred embodiments of the present invention are described herein with particularity, those having normal skill in the art will recognize various changes, modifications, additions and applications other than those specifically mentioned herein without departing from the spirit of this invention.

What is claimed is:

1. Apparatus for detecting input light and for generating an output as a function of the detection of said input light, comprising:

a semiconductor wafer having a membrane formed therein in such a manner that said wafer surrounds and physically supports said membrane;

said membrane having a first roughened surface for receiving said input light, and having a second surface that is opposite said first surface;

said membrane having a thickness extending between said first and second surfaces that is on the order of an absorption length of said input light or less;

said roughened surface operating to cause said input light to reflect internally within said thickness of said membrane; and said membrane operating to internally release free carriers within said thickness of said membrane in response to the presence of said input light;

a source of membrane biasing voltage;

at least a first and a second electrical contact pair attached to physically spaced portions of said second side of said membrane;

first circuit means including an impedance connecting said at least first and second electrical contact pair to said source of biasing voltage, said first circuit means for voltage biasing said membrane and for generate a current flow through said impedance that is proportional to said released free carriers;

integrated circuit means fabricated on said wafer; and second circuit means connecting said integrated circuit means to be controlled by said current flow through said impedance, said integrated circuit means operating to provide said output as a function current flow through said impedance.

2. The apparatus of claim 1, including;

microchannels within a volume of said wafer that surrounds and is exclusive of said membrane, said microchannels having a fluid-flow input and a fluid-flow output; and a source of cooling medium connected to said fluid-flow input and said fluid-flow output.

3. The apparatus of claim 1 wherein said semiconductor wafer is a silicon wafer.

4. The apparatus of claim 3 wherein said membrane is a silicon P-I-N diode.

5. The apparatus of claim 4 wherein said integrated circuit means is constructed using CMOS technology.

6. The apparatus of claim 1, including:

an antireflective coating applied in overlying relation to said first roughened side of said membrane.

7. Array apparatus for detecting input light and for generating an output as a function of the detection of said input light, comprising:

a semiconductor wafer having a membrane formed therein;

a plurality N of detector holes formed in said semiconductor wafer in such a manner that said semiconductor wafer individually surrounds and physically supports a plurality N of membrane portions;

each of said membrane portions having a first roughened surface for receiving said input light, and having a second surface that is opposite said first roughened surface;

each of said membrane portions having a membrane-portion thickness extending between said first and second surfaces that is on the order of an absorption length of said input light or less;

said first roughened surface of each of said membrane portions operating to cause said input light to reflect internally within said membrane-portion thickness;

each of said membrane portions operating to internally release free carriers within said membrane-portion thickness in response to the presence of said input light;

a source of biasing voltage;

a plurality N of electrical contact pairs;

each of said electrical contact pairs being attached to physically spaced portions of said second surface of one of said membrane portions;

a plurality N of first circuit means;

each of said first circuit means including one of a plurality N of impedances that individually connect one of said electrical contact pairs to said source of biasing voltage;

each of said first circuit means operating to voltage bias one of said membrane portions;

each of said first circuit means operating to generate a current flow through one of said impedances;

said current flow being proportional to said released free carriers within said membrane-portion thickness of one of said membrane portions;

a plurality N of second circuit means;

each of said second circuit means being connected to be controlled by said current flow through one of said plurality N of impedances; and a plurality N of output light beam generating means individually controlled by one of said plurality N of second circuit means.

8. The array apparatus of claim 7, including:

a plurality N of antireflective coatings, each individual one of said antireflective coatings being applied in overlying relation to said first roughened surface of an individual one of said membrane portions.

9. The array apparatus of claim 8 including:

microchannels within a volume of said semiconductor wafer that surrounds but is exclusive of said plurality N of membrane portions, said microchannels having a fluid-flow input and a fluid-flow output; and a source of cooling medium connected to said fluid-flow input and said fluid-flow output.

10. The array apparatus of claim 1 wherein said plurality N of output light beam generating means comprises N vertical cavity lasers.

* * * * *